United States Patent [19]
Leung

[11] Patent Number: 6,078,547
[45] Date of Patent: Jun. 20, 2000

[54] METHOD AND STRUCTURE FOR CONTROLLING OPERATION OF A DRAM ARRAY

[75] Inventor: Wingyu Leung, Cupertino, Calif.

[73] Assignee: MoSys, Inc., Sunnyvale, Calif.

[21] Appl. No.: 09/076,608

[22] Filed: May 12, 1998

[51] Int. Cl.[7] ..................................................... G11C 8/00
[52] U.S. Cl. ........................................ 365/233; 365/233.5
[58] Field of Search .............................. 365/233, 233.5; 711/122; 395/750.04

[56] References Cited

U.S. PATENT DOCUMENTS

| | | | |
|---|---|---|---|
| 5,615,169 | 3/1997 | Leung | 365/233.5 |
| 5,708,624 | 1/1998 | Leung | 365/233 |
| 5,778,237 | 7/1998 | Yamanoto et al. | 395/750.04 |
| 5,829,026 | 10/1998 | Leung et al. | 711/122 |

*Primary Examiner*—David Nelms
*Assistant Examiner*—David Lam
*Attorney, Agent, or Firm*—Skjerven, Morrill, MacPherson, Franklin & Friel LLP; Norman R. Klivans

[57] ABSTRACT

A method and structure for handling the refresh of a DRAM array so that the refresh has no effect on the external access. A system clock signal initiates activation and deactivation of elements of the DRAM array using a sequencer which subdivides each system clock signal period into three parts, thus providing four control signals fixed phase relationship per clock period.

10 Claims, 4 Drawing Sheets

METHOD AND STRUCTURE FOR CONTROLLING OPERATION OF A DRAM ARRAY

BACKGROUND OF THE INVENTION

1. Field of the invention

The present invention relates to the operation of a dynamic random access memory (DRAM) array. More specifically, the present invention relates to a method and structure for using a synchronous clock signal to control the internal operations of a DRAM array.

2. Description of the Prior Art

U.S. Pat. Nos. 5,708,624 and 5,615,169 issued to the same inventor and commonly owned as this Application and incorporated herein by reference in their entireties, are directed to controlling internal operations of a DRAM array. DRAM (Dynamic Random Access Memory) is well known, for instance in computer systems, for storage of data. U.S. Pat. No. 5,708,624 discloses method and structure for controlling the timing of an access to a DRAM array, for instance on an integrated circuit chip, in response to a row access signal and rising/falling edges of a clock signal. Row address decoding and the deactivation of equalization circuits are initiated when the row access signal is received and a first transition of the clock signal is detected. The row address decoding and the deactivation of the equalization circuits are completed before a second transition of the clock signal occurs.

A second transition is then used to initiate the turning on of the sense amplifiers of the DRAM array. The sense amplifiers are turned on before a third transition of the clock signal. The third transition of the clock signal is then used to initiate the column address decoding operation of the DRAM array. In an alternative embodiment, the column address decoding is initiated when a column access signal is asserted and the clock signal undergoes the third transition. The first, second and third transitions can be consecutive or non-consecutive edges of the clock signal. A problem with this prior art is that the DRAM array operations take more than one clock cycle. This is not compatible with a DRAM array that is intended for instance to be compatible with SRAM.

SUMMARY

Therefore in accordance with this invention a system clock signal is used to initiate the activation and deactivation of elements of a DRAM array, thereby eliminating timing uncertainties introduced by the delay elements of prior art DRAM accessing schemes and allowing all the DRAM array operations to be completed in one clock cycle.

Therefore the present address sequencing method involves receiving a system clock signal and an access signal which is asserted to initiate an access of the DRAM memory array. These two signals are received by a memory sequencer which generates the appropriate control signals including the row and column address signals for controlling operations of the memory array. This memory sequencer includes, in one embodiment, a phase locked loop (or alternatively a delay line clock phase generator) which outputs in one embodiment four timing signals per clock cycle. These timing signals bear a fixed phase relationship to the clock signal irrespective of the clock signal frequency. (In contrast, other prior approaches use delay lines to generate timing signals which have no phase relationship with the clock.)

These four timing signals are each applied to the clock and reset terminals of D-type registers where four such D-type registers are chained together. The first D-type register has its data terminal driven by the memory access signal. Therefore the four registers output the four needed control signals which are e.g. a row address signal, a column address signal, a turn on of sense amplifier signal, and a turn off of the column switches, sense amplifiers, word line and equalization of the bit line. The phase locked loop (or alternative clock phase generator) is such that the four control signals maintain fixed phase relationships inside each clock period. The embodiment with the clock phase generator uses a delay line arrangement with multiple delay lines which are chained together to provide the desired timing signals.

The present method allows an SRAM compatible device to be built from such DRAM or 1-Transistor cells. By utilizing the unused external access time for performing the infrequent memory refresh, this approach does not impose a penalty on the peak bandwidth requirement of the memory array.

DETAILED DESCRIPTION

In accordance with the present invention, a system clock signal is used to initiate the activation deactivation of selected word lines, sense amplifiers, and column switches of a DRAM array, thereby eliminating the timing uncertainties introduced by the delay elements of prior art DRAM accessing schemes.

Figure 1:
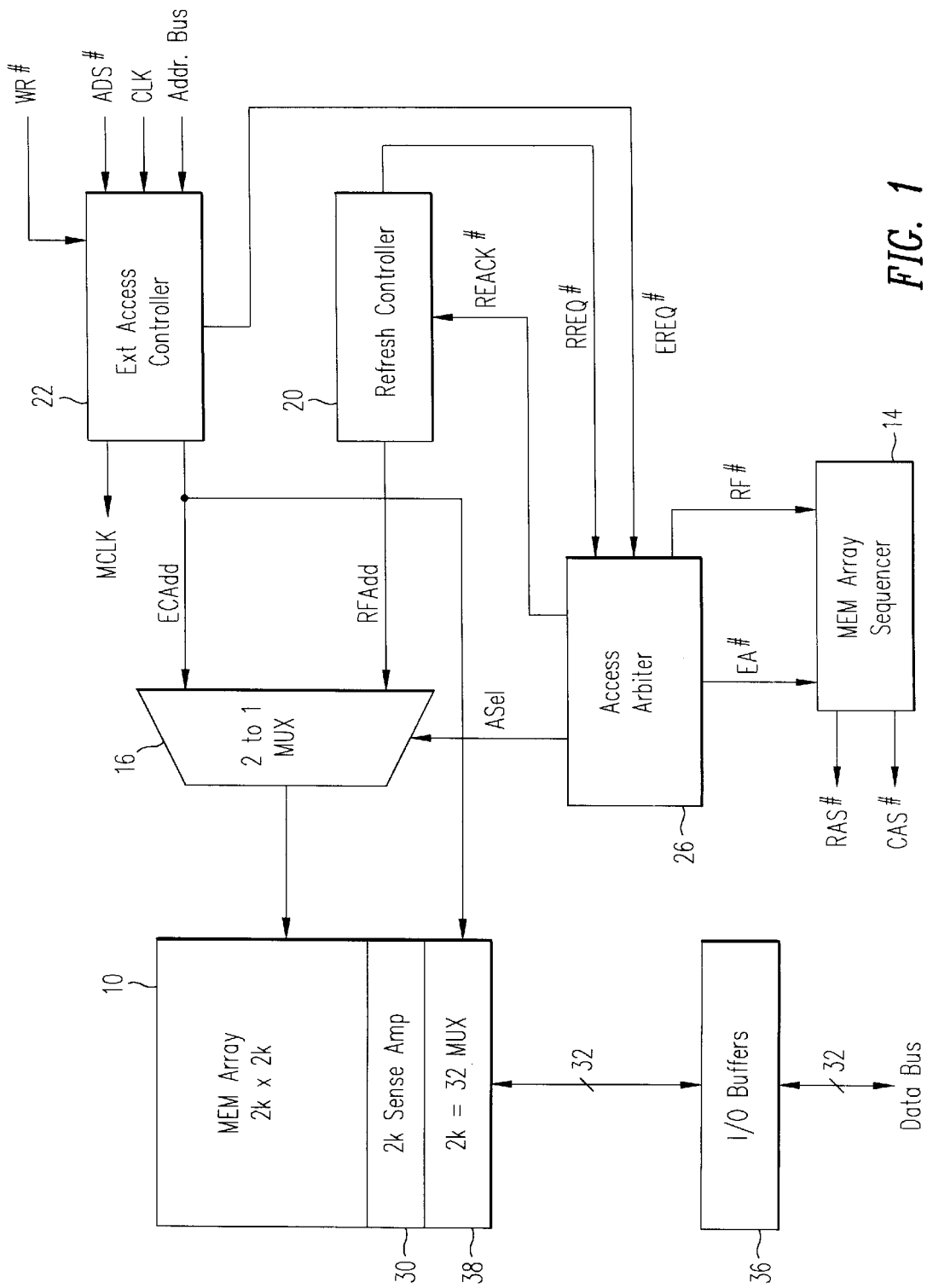
FIG. 1 shows a block diagram of a memory system using the present invention.

FIG. 1 shows an example of a memory system with a memory cell array containing 128K words of 32-bits, and is identical to FIG. 1 of copending U.S. patent application Ser. No. 09/037,396, filed Mar. 9, 1998, "Method and Apparatus for 1-T SRAM compatible Memory," Wingyu Leung, incorporated herein by reference herein in its entirety. The present memory sequencing and sequencer are intended for use in such a system, but are not so limited. The array of FIG. 1 therefore has 32 data I/O lines. The system includes the memory cell array 10, a memory array sequencer 14, a memory address multiplexer 16, a refresh controller 20, an external access controller 22 and an access arbiter 26. The memory array is arranged into 2K rows and 2K columns. Associated with each column is a sense-amplifier in block 30 which performs the data sensing, restore and write operation. During each access, one cell array row is activated and the 2K memory cells of that row are connected to the sense-amplifiers 30 in each column.

The sense-amplifiers 30 are conventionally connected to the I/O buffers 36 through a set of 2K-to-32 column multiplexers 38. The memory array sequencer 14 generates the conventional DRAM control signals RAS# and CAS# for controlling the operation of the array. Functions of the RAS# and CAS# signals are similar to those described in U.S. Pat. No. 5,615,169. The external access controller 22 interprets external access commands and generates read/write requests. In one embodiment, two signals are used to determine an external access: Clock (CLK), and Address-Strobe (ADS#). The external access is detected at the rising clock edge on the activation of an Address-Strobe (ADS#) signal.

In FIG. 1, signals RF#, EA#, RFADD and ECADD refer to respectively to refresh, external access, refresh address, and external access address.

One embodiment of this invention therefore includes a method of operation of a DRAM array as in FIG. 1 in response to a system clock signal CLK and an access signal ADS#. The access signal is asserted to initiate an access to the DRAM array. A memory array sequencer 14 (in one embodiment of the type described further below) generates the control signals RAS#, SEN#, CAS#, and PRC# for controlling the operations of the memory array. RAS# controls the row address decoding, the turn on of the word line WL, and the turn off of the bit line equalization EQ (precharging) conventionally present in array 10. SEN# controls the turn on of the sense amplifiers SA and SA#. CAS# controls the column address decoding and the turning on of column switches CSW also conventionally present in array 10. PRC# when activated turns off the column switches, sense amplifiers, word line WL and turns back on the bit line equalization.

Figure 2:
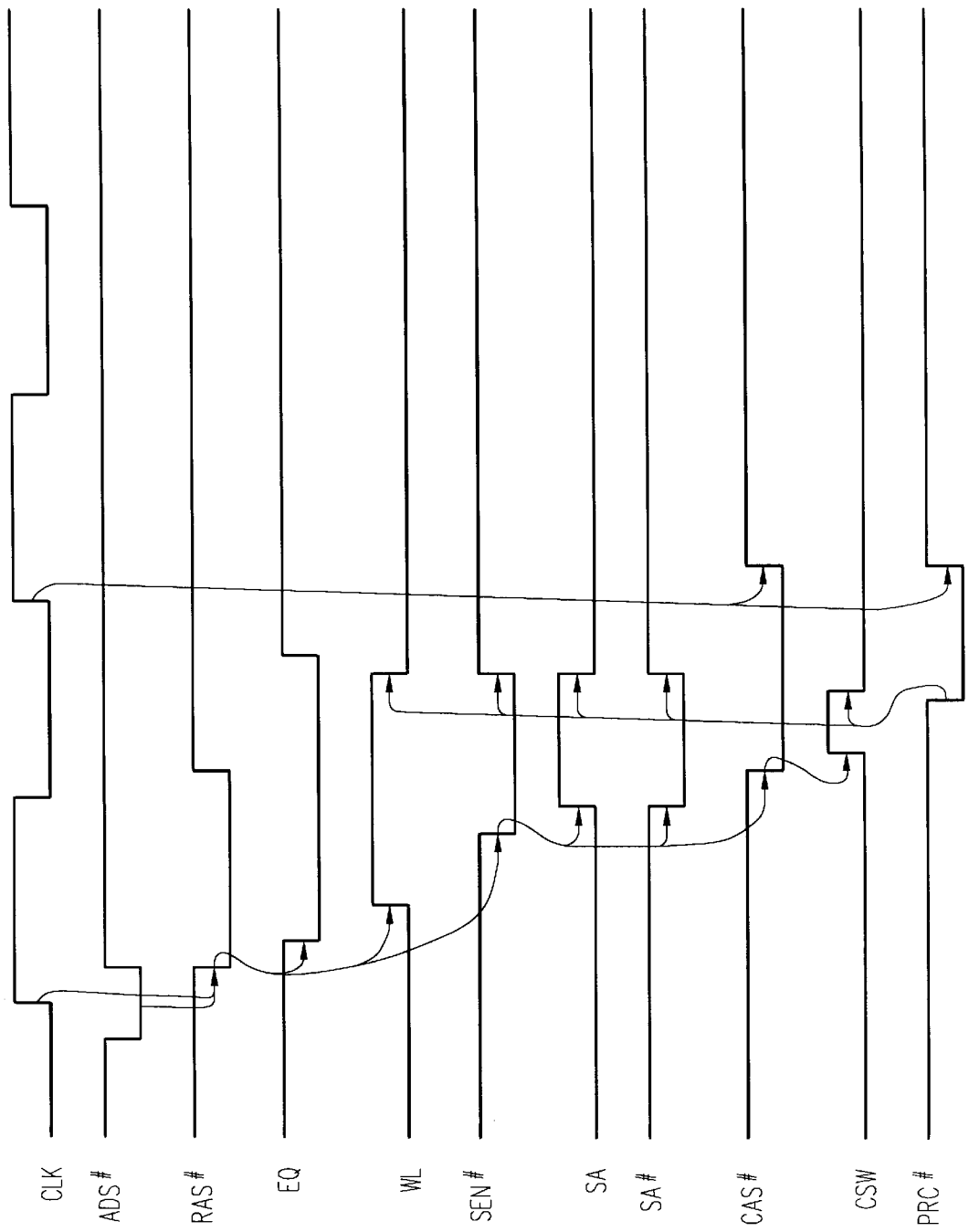
FIG. 2 is a timing diagram of operation of one embodiment of this invention.

Timing signals are generated by a clock phase generator so that RAS#, SEN#, CAS# and PRC# maintain a fixed phase relationship in a clock period. In one embodiment RAS# is asserted at the rising clock-edge after the assertion of ADS#; SEN# is asserted ⅓ of a clock period after the RAS# is asserted; CAS# is asserted ½ of a clock period after the RAS# is asserted; and PRC# is asserted ⅔ of a clock period after the RAS# is asserted. FIG. 2 shows the timing of these signals where the horizontal axis is time and the vertical axis is voltage.

In one variation of this method, the clock signal is a system clock signal. In another variation, the clock signal is generated by a phase locked loop or other circuit from a system clock signal.

Figure 3:
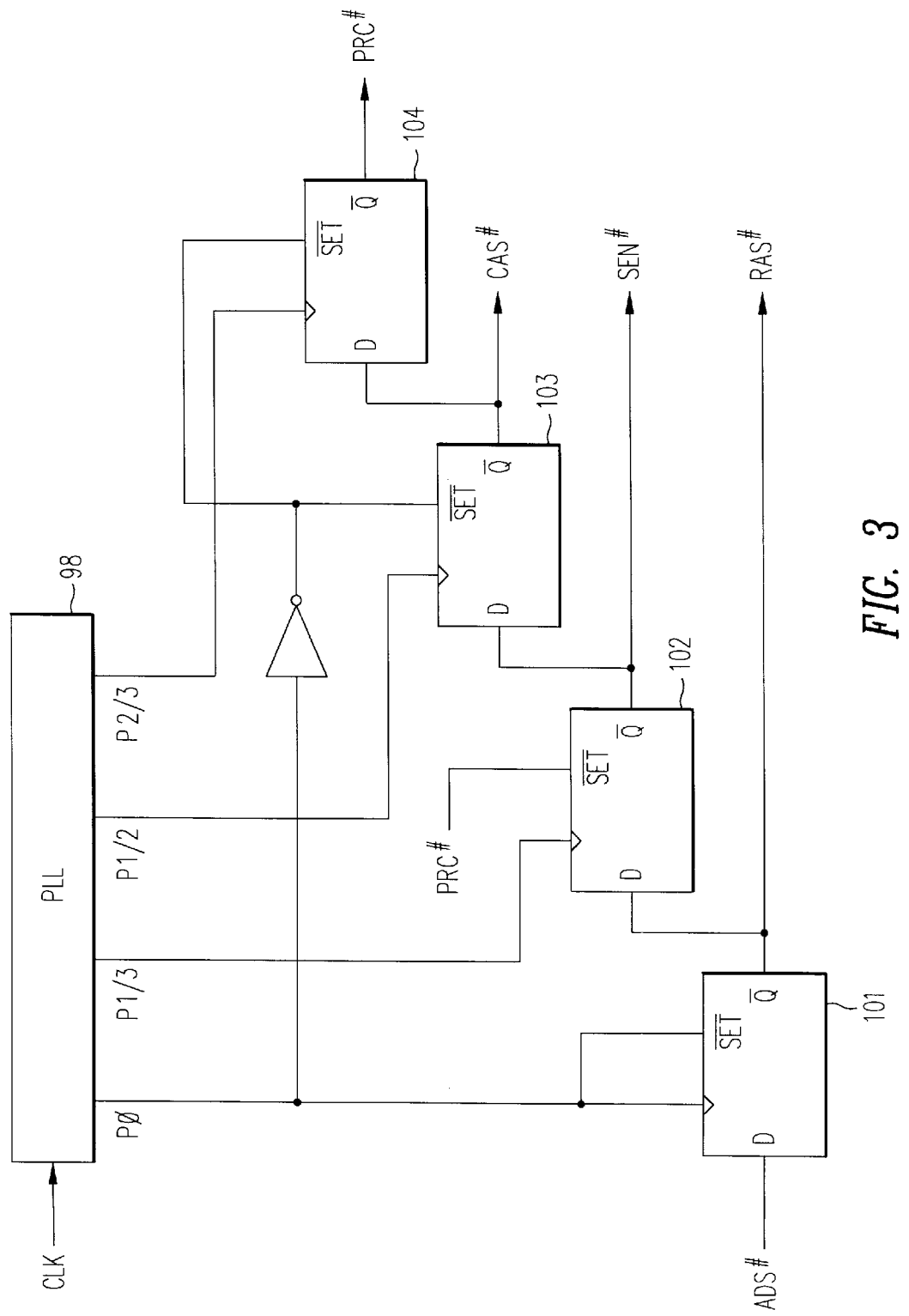
FIG. 3 is a sequencer in accordance with this invention.

FIG. 3 shows a schematic diagram of the present DRAM memory array sequencer which generates the above-mentioned control signals for the operations of the memory array. (This sequencer would be element 14 in FIG. 1.) The sequencer in this embodiment includes a conventional PLL 98 (phase locked loop) similar to the one described in W. Leung et al. *ISSCC Digest of Technical Papers*, 1994 "PLL Design for a 500 MB/s Interface", and D-registers 101–104. The PLL has four output clock (timing) signals; P0, P1/3, P1/2, and P2/3 which respectively maintain a phase relationship of 0, ⅓, ½, and ⅔ of a clock period with the input CLK signal. The D-registers 101, . . . , 104 are identical and each has an asynchronous input terminal $\overline{SET}$ for setting the output signal $\overline{Q}$ high.

During operation, input signal ADS# is sampled at the rising clock edge of signal P0 by resister 101. (The EA# and RF# signals are used to suppress the activation of the CAS# signal and are not relevant to the timing generation.) In case ADS# is low, RAS# is driven low by the Q output signal of register 101. Register 102 samples activation of signal RAS# one-third of a clock period later and drives SEN# low. Register 103 samples the activation low of signal SEN# approximately ½ clock period after signal ADS# is detected low, and drives signal CAS# low. Register 104 samples the activation of CAS# signal ⅔ of a clock period after ADS# is detected low and drives signal PRC# low. When signal P0 goes low, RAS# is reset high. The activation of PRC# resets SEN# high. Likewise, signals CAS# and PRC# are reset high when P0 goes high.

Figure 4:
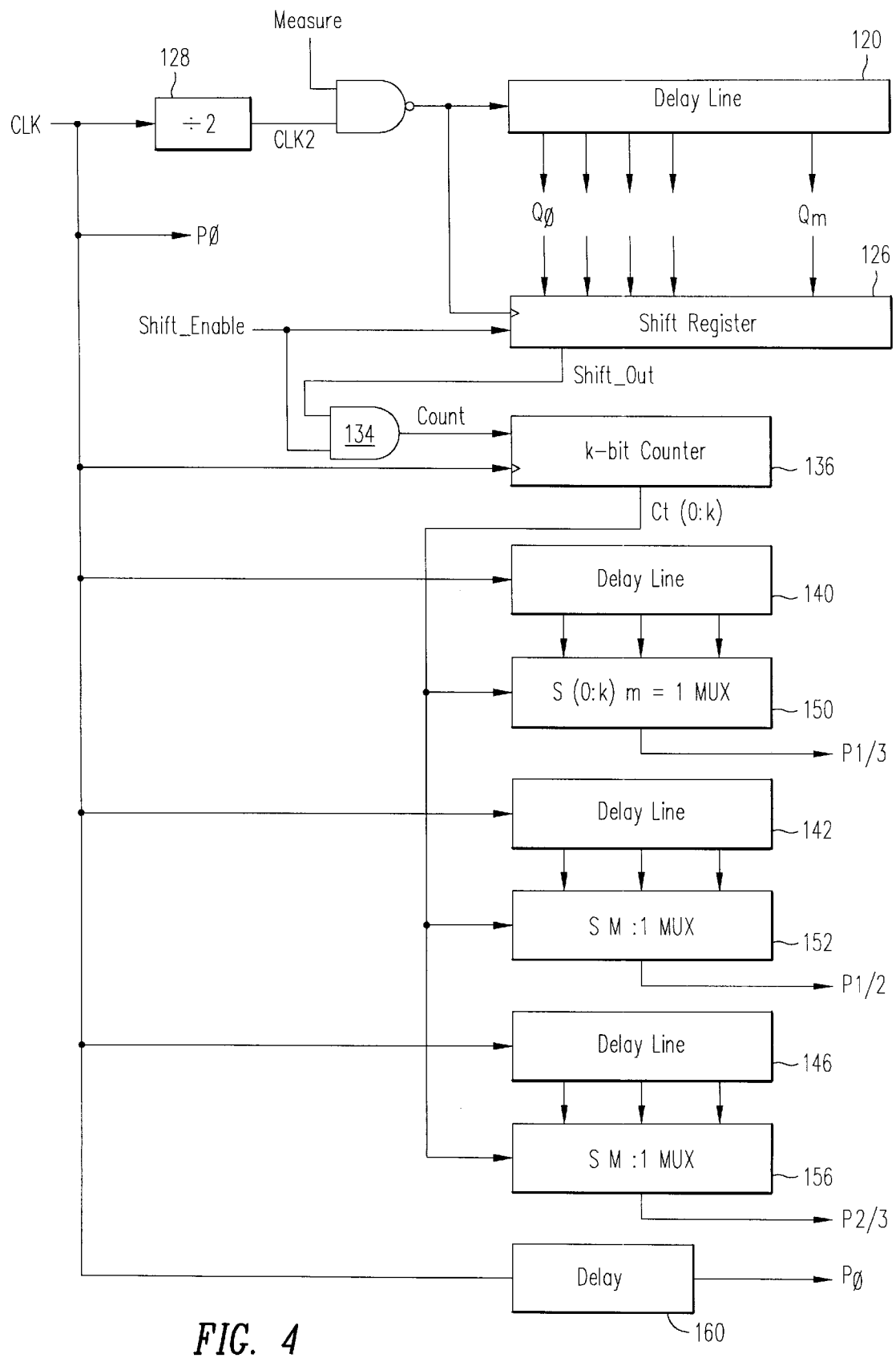
FIG. 4 is an alternative circuit to the PLL of FIG. 3.

In another embodiment, the PLL 98 of FIG. 3 is replaced by the clock phase generator circuit of FIG. 4 which generates the P0, P1/3, P1/2 and P2/3 clock signals using delay lines. Delay line 120 consists of m delay stages each with a delay of x ns so that the total delay m times n is greater than one clock period. Typical values of m and x are respectively 20 and 1. Signals Q(0:m) are the output signals of the m delay stages of delay line 20. Signals Q(0:m) are coupled to the parallel input terminal of a shift register 126.

Input signal Measure is normally low, which sets the output signals Q(0:m) low. When signal Measure goes high and the output signal CLK2 of the divide by two counter 128 goes high, signal Q0, followed by signal Q1, then signal Q2 go high one-by-one until signal CKL2 goes low. At the same time, state (signal values) Q(0:m) is latched into the shift register 126. When signal Shift_enable goes high, the shift register 126 starts left shifting and the k-bit binary counter 136 starts counting. The counter 136 count continues until the output signal Shift_Out of the shift register 126 goes low. Thus, the count value in the k-bit counter 136 (via AND gate 134) represents the number of delay stages in one clock period.

Delay lines 140, 142 and 146 consist respectively of m stages of delay elements of ⅓, ½, and ⅔ times delay x ns. The control terminals of the associated multiplexers 150, 152, 156 are connected to terminals Ct(0:k), which are the output terminals of the k-bit counter 136. The signal CLK is the input to delay lines 140, 142, 146 as well as to delay element 160 which has a delay equal to the delay of each of the multiplexers 150, 152, or 156. The output signals of multiplexers 150, 152 and 156 are clock signals with ⅓, ½ and ⅔ of a clock period delay from P0. Clock signal P0, P1/3, P1/2 and P2/3 are thus obtained from the output of the delay element 160, and delay lines 140, 142 and 146 respectively.

Thus this clock phase generator of FIG. 3 uses counter 136 to output a count corresponding to a number of delay elements in delay line 120 needed to provide a delay equal to one clock period. The other delay lines 140, 142, 146 each provide a delay equal to a fraction (⅓, ½, ⅔) of the delay provided by delay line 120.

This disclosure is illustrative and not limiting; further modifications will be apparent to one skilled in the art in light of this disclosure and are intended to fall within the scope of the appended claims.

I claim:

1. A method of operating a DRAM array having a plurality of memory cells arranged in rows and columns, with associated column switches, sense amplifiers, bit lines, and word lines, comprising:

receiving a clock signal;

subdividing a period of the clock signal so as to generate at least two timing signals having a fixed phase relationship during the period;

using each of the timing signals to generate control signals for operating the DRAM array.

2. The method of claim 1, wherein there are four control signals, respectively controlling row addressing, turning on the sense amplifiers in the DRAM array, column addressing, and equalization of the bit lines.

3. The method of claim 2, wherein the row addressing signal also turns on a word line and turns off a bit line equalization of the array; the column addressing signal also turns on column switches of the array; and the equalization of the bit lines signal also turns off the column switches, the word lines, and the sense amplifiers.

4. The method of claim 1, wherein the subdividing includes driving a phase locked loop with the clock signal.

5. The method of claim 1, wherein the subdividing includes driving a delay line with the clock signal.

6. A sequencer for control of operation of a DRAM array having a plurality of rows and columns of memory cells, sense amplifiers associated with the memory cells, and word lines, bit lines, column switches, and bit equalization lines associated with the memory cells, the sequencer comprising:

an input terminal for receiving a clock signal; and a timing element coupled to the input terminal and which outputs at least two timing signals per clock signal period, the two timing signals having a fixed phase relationship.

7. The sequence of claim 6, wherein there are four timing signals, and further comprising:

at least four chained registers, each having its clock terminal coupled to receive one of the timing signals, a first register in the chain having its input terminal coupled to receive an access signal, wherein the four registers each output a control signal for controlling respectively row addressing, turning on the sense amplifiers, column addressing, and equalization of the bit lines.

8. The sequencer of claim 7, wherein the row addressing signal also turns on a word line and turns off a bit line equalization of the array; the column addressing signal also turns on column switches of the array; and the equalization of the bit lines signal also turns off the column switches, the word lines, and the sense amplifiers.

9. The sequencer of claim 6, wherein the timing element includes a phase locked loop driven by the clock signal.

10. The sequencer of claim 6, wherein the timing element includes a delay line driven by the clock signal.

* * * * *